(12) United States Patent
Kawakita et al.

(10) Patent No.: US 7,525,829 B2
(45) Date of Patent: Apr. 28, 2009

(54) SEMICONDUCTOR STORAGE DEVICE

(75) Inventors: Keizo Kawakita, Tokyo (JP); Yoshinori Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 390 days.

(21) Appl. No.: 11/543,867

(22) Filed: Oct. 6, 2006

(65) Prior Publication Data

US 2007/0081375 A1    Apr. 12, 2007

(30) Foreign Application Priority Data

Oct. 11, 2005    (JP)    ............................. 2005-296204

(51) Int. Cl.
*G11C 5/06*    (2006.01)
(52) U.S. Cl. ......................................... 365/63; 365/51
(58) Field of Classification Search .................. 365/63, 365/51
See application file for complete search history.

(56) References Cited

U.S. PATENT DOCUMENTS 6,639,822 B2 * 10/2003 Fujisawa et al. ............... 365/63
6,754,114 B2 *  6/2004 Horiguchi et al. ........... 365/200

FOREIGN PATENT DOCUMENTS

JP         2003-273245 A     9/2003

* cited by examiner

*Primary Examiner*—Son Dinh
(74) *Attorney, Agent, or Firm*—McDermott Will & Emery LLP

(57) ABSTRACT

A semiconductor storage device that is capable of utilizing dummy cells effectively and enhancing the memory cell density. Every second row of bit lines (second bit lines) in terminal memory mats 101A, 101C is not connected to first sense amplifiers SA1. Second sense amplifiers SA2 are arranged on the outside of the terminal memory mats, and second bit lines are connected according to a folded bit line system to the second sense amplifiers SA2. Two memory cells provided at the points where a word line WL intersects with a pair of bit lines BL, /BL connected to the second sense amplifiers SA2 constitute a twin cell unit TWC for storing a single bit of data in complementary fashion.

16 Claims, 9 Drawing Sheets

SEMICONDUCTOR STORAGE DEVICE

TECHNICAL FIELD

The present invention relates to a semiconductor storage device, and particularly relates to DRAM (Dynamic Random Access Memory) or another semiconductor storage device that uses an open bit line system as the system by which a sense amplifier is connected to a bit line pair.

BACKGROUND OF THE INVENTION

System by which a sense amplifier is connected to a bit line pair in DRAM, which is a type of semiconductor storage device, include an open bit line system and a folded bit line system (see Japanese Laid-Open Patent Application No. 2003-273245). In an open bit line system, two bit lines that are connected to a single sense amplifier are wired in opposite directions from each other on either side of the sense amplifier. In a folded bit line system, two bit lines that are connected to a single sense amplifier are turned back at the sense amplifier and wired in the same direction.

FIG. 6 is a circuit diagram showing the basic structure of a folded bit line system.

As shown in FIG. 6, in the folded bit line system, the pair of bit lines BL, /BL connected to the sense amplifier SA is laid parallel and in the same direction. Both bit lines BL, /BL are therefore intersected by the same word line WL. Accordingly, in order for a single bit of data to be stored in a single memory cell MC, a memory cell MC must be placed at the intersection point of any one of the bit lines BL, /BL with a word line WL and a memory cell MC cannot be placed at all the nodes.

FIG. 7 is a circuit diagram showing the basic structure of the open bit line system.

As shown in FIG. 7, in the open bit line system, the two of bit lines BL, /BL connected to the sense amplifier SA are laid in opposite directions from each other on either side of the sense amplifier. Therefore, the same word line WL never intersects both of the bit lines BL, /BL. It is therefore possible to place a memory cell MC at all of the nodes. In this case, the theoretical minimum surface area of a memory cell is $4F^2$ ($2F \times 2F$), according to a system in which the surface area of a memory cell is indicated using a value (minimum feature size) "F" that is half the pitch of the word lines, and the typical surface area of a memory cell at a single node is $6F^2$ ($2F \times 3F$).

In a conventional DRAM that uses an open bit line system, sense amplifiers SA are in a distributed arrangement, and the density with which memory cells are formed in the memory mats 101A, 101C at the end portions within the chip, or at the end portions (portions in which the continuity of the memory mats is interrupted) of the peripheral circuit, is half the density with which memory cells are formed in the other memory mat 101B, as shown in FIG. 8. When such a difference in density exists, the optimal processing conditions differ between memory mats. In order to eliminate this type of density difference, dummy bit lines DBL that are not connected to the sense amplifier SA must be wired to the memory mats 101A, 101C, and dummy cells DC must be formed at the intersections of the dummy bit lines DBL with the word lines, as shown in FIG. 9. This configuration makes it possible to make the optimal processing conditions nearly the same among the memory mats 101A, 101C at the ends and the memory mat 101B in the middle.

However, this type of dummy cell DC is not utilized at all in the conventional DRAM, and was of no use to the circuit.

SUMMARY OF THE INVENTION

Therefore, an object of the present invention is to provide a semiconductor storage device that is capable of effectively utilizing dummy cells and enhancing the memory cell density.

The above and other objects of the present invention can be accomplished by a semiconductor storage device comprising a plurality of memory mats and a plurality of sense amplifier array regions arranged in alternate fashion, wherein the plurality of sense amplifier array regions includes first sense amplifier array regions that are connected according to an open bit line system to bit lines included in memory mats that are adjacent on both sides, and second sense amplifier array regions that are connected according to a folded bit line system to bit lines included in a memory mat that is adjacent on one side.

It is preferred in the present invention that the plurality of memory mats comprise an intermediate memory mat between the first sense amplifier array regions, and terminal memory mats that are between the first sense amplifier array regions and the second sense amplifier array regions; that the terminal memory mats include first bit lines that are connected to corresponding memory cells in response to the activation of prescribed word lines, and second bit lines that are connected to corresponding memory cells in response to the activation of the prescribed word lines; and that the first and second bit lines both be connected to the same sense amplifiers provided to the second sense amplifier array region.

It is preferred in the present invention that complementary data be stored by the memory cells disposed at the intersection points of the prescribed word lines and the first bit lines, and the memory cells disposed at the intersection points of the prescribed word lines and the second bit lines.

It is preferred in the present invention that the terminal memory mats further comprise third bit lines that are connected to corresponding memory cells in response to activation of the prescribed word lines, wherein the third bit lines are connected to one end of sense amplifiers provided to the first sense amplifier array region. The third bit lines are also preferably interposed between the first and second bit lines. This structure makes it possible to arrange the first sense amplifiers in a distributed fashion, and to create an efficient layout. It is also possible to maintain a relatively wide spacing in the layout of the second sense amplifiers, and to arrange the second sense amplifiers so as to be concentrated on the outside of the terminal memory mats.

The above and other objects of the present invention can also be accomplished by a semiconductor storage device comprising a plurality of word lines, a plurality of bit lines, a plurality of memory cells disposed at intersection points of the word lines and the bit lines, and a plurality of sense amplifiers that are connected to the bit lines, wherein the plurality of word lines includes first and second word lines that are activated exclusively; the plurality of bit lines includes first through third bit lines that are each connected to corresponding memory cells in response to activation of the first word lines, and fourth bit lines that are connected to corresponding memory cells in response to activation of the second word lines; and the plurality of sense amplifiers includes first sense amplifiers for amplifying potentials between the third and fourth bit lines, and second sense amplifiers for amplifying potentials between the first and second bit lines.

It is preferred in the present invention that the first sense amplifiers be disposed at one end of the first through third bit lines, and that the second sense amplifiers be disposed at the other end of the first through third bit lines.

It is preferred in the present invention that the first sense amplifiers be disposed between the third bit lines and the fourth bit lines. This structure makes it possible to arrange the first sense amplifiers in a distributed fashion, and to create an efficient layout. It is also possible to maintain a relatively wide spacing in the layout of the second sense amplifiers, and to arrange the second sense amplifiers so as to be concentrated on the outside of the terminal memory mats.

It is preferred in the present invention that complementary data be stored by the memory cells disposed at the intersection points of the first word lines and the first bit lines, and the memory cells disposed at the intersection points of the first word lines and the second bit lines.

The above and other objects of the present invention can also be accomplished by a semiconductor storage device comprising a plurality of memory mats, first sense amplifier array regions provided between adjacent memory mats, and second sense amplifier array regions provided on the outside of terminal memory mats; wherein the plurality of memory mats includes a plurality of word lines, a plurality of bit lines, and a plurality of memory cells disposed at the intersection points of the word lines and the bit lines; the plurality of bit lines includes first bit line pairs that are connected according to an open bit line system to sense amplifiers provided to the first sense amplifier array regions, and second bit line pairs that are connected according to a folded bit line system to sense amplifiers provided to the second sense amplifier array regions; and two memory cells provided at the intersection points of the word lines and the second bit line pairs constitute a twin-cell unit for storing complementary data.

It is preferred in the present invention that bit lines extending from the first sense amplifier array regions, and bit lines extending from the second sense amplifier array regions be wired in alternating fashion. It is also preferred that bit lines extending from the first sense amplifier array region on one side, and bit lines extending from the first sense amplifier array region on the opposite side be wired in alternating fashion to the intermediate memory mat that is interposed between the first sense amplifier array regions. This structure makes it possible to arrange the first sense amplifiers in a distributed fashion, and to create an efficient layout. It is also possible to maintain a relatively wide spacing in the layout of the second sense amplifiers, and to arrange the second sense amplifiers so as to be concentrated on the outside of the terminal memory mats.

It is preferred in the present invention that the twin cell unit comprises a redundant cell. This configuration makes it possible to increase only the number of redundant cells within a chip without reducing the capacity of a normal memory cell. Since a twin cell also has tREF characteristics that are superior to those of a single memory cell, even further enhancement of the tREF characteristics over those of a conventional redundant cell can be anticipated.

According to the present invention, second sense amplifiers that are connected to dummy bit lines are provided, the second sense amplifiers and two adjacent dummy bit lines are connected according to a folded bit line system, and a twin cell is formed using two memory cells on a pair of dummy bit lines that are connected to the second sense amplifiers. Dummy bit lines can therefore be omitted from the terminal memory mats, thereby enhancing the cell density as well as reducing the chip surface area. Since twin cells and normal memory cells can both be disposed on a single chip, reduced power consumption and enhanced refresh characteristics can be anticipated.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention will now be described in detail hereinafter with reference to the accompanying drawings.

Figure 1:
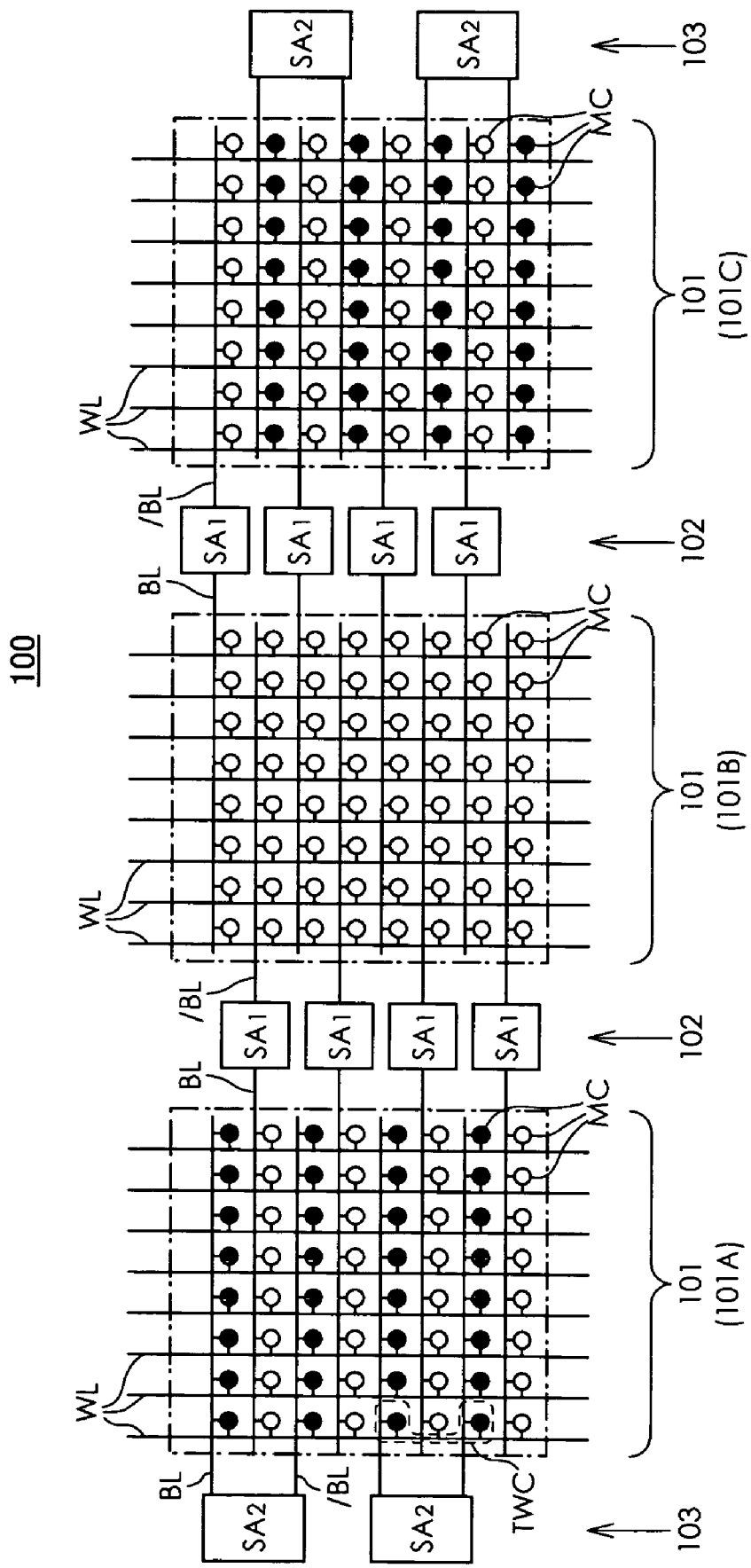
FIG. 1 is a schematic circuit diagram showing the circuit structure of DRAM according to a preferred embodiment of the present invention.

FIG. 1 is a schematic circuit diagram showing the circuit structure of DRAM according to a preferred embodiment of the present invention.

As shown in FIG. 1, the DRAM 100 is provided with a plurality of memory mats 101 that constitute a region in which a memory cell array is formed, first sense amplifiers SA1 that are provided between adjacent memory mats 101, and second sense amplifiers SA2 that are provided to the outside of the terminal memory mats 101A and 101C. In the present embodiment, the plurality of memory mats 101 and a plurality of sense amplifier array regions 102 and 103 are arranged in alternating fashion. In other words, the plurality of memory mats 101 is broadly classified into an intermediate memory mat 101B that is disposed between the other memory mats that are present on both sides thereof in the row direction (wiring direction of the bit lines), and terminal memory mats 101A and 101C flanked by a memory mat on only one side thereof. The plurality of sense amplifier array regions 102 and 103 is composed of first sense amplifier array regions 102 that are connected according to an open bit line system to the bit lines included in the memory mats adjacent on either side, and second sense amplifier array regions 103 that are connected according to a folded bit line system to the bit lines included in the memory mat adjacent on one side. Thus, array regions 102 of first sense amplifiers SA1 are provided on both sides of the intermediate memory mat 101B, whereas an array region 102 of first sense amplifiers SA1 is provided on only one side of the terminal memory mats 101A and 101C, and an array region 103 of second sense amplifiers SA2 is provided on the opposite side thereof. Word lines WL and bit lines BL (or /BL) are provided in a lattice pattern within each memory mat 101, and memory cells MC are provided at the intersection points of the word lines WL and bit lines BL, /BL.

When activated, the first and second sense amplifiers SA1, SA2 perform differential amplification of the potential difference of the corresponding bit line pairs BL, /BL. The first sense amplifiers SA1 are distributed in alternating fashion (staggered fashion) so as not to be continuous in a single array region 102, and an efficient layout is thereby obtained. An open bit line system is used to connect the first sense amplifiers SA1 with the bit line pairs BL, /BL. In other words, bit lines BL in pairs of bit lines connected to the first sense amplifiers SA1 are used as bit lines within memory mats 101 that are to the left of the first sense amplifiers SA1, and bit lines /BL are used as bit lines within memory mats 101 that are to the right of the first sense amplifiers SA1. The plurality of bit lines provided in the intermediate memory mat 101B therefore include bit lines /BL that extend from the row of first sense amplifiers SA1 on the left of the memory mat 101B, and bit lines BL that extend from the row of first sense amplifiers SA1 on the right of the memory mat 101B. The bit lines BL and /BL are wired in alternating fashion in the intermediate memory mat 101B.

Every other bit line provided in the terminal memory mats 101A, 101C is not connected to the first sense amplifiers SA1. These bit lines were present as dummy bit lines in the conventional technique, but in the present embodiment, second sense amplifiers SA2 are arranged on the outsides of the terminal memory mats, and the aforementioned bit lines are connected to the second sense amplifiers SA2 according to a folded bit line system. The two memory cells provided to the intersection points of a word line WL and the pair of bit lines BL, /BL connected to a second sense amplifier SA2 thereby constitute a single-node cell and two-cell/bit memory cell that forms a twin-cell unit TWC for storing 1-bit data in complementary fashion. In FIG. 1, memory cells that form twin-cell units are indicated by black dots.

Figure 2:
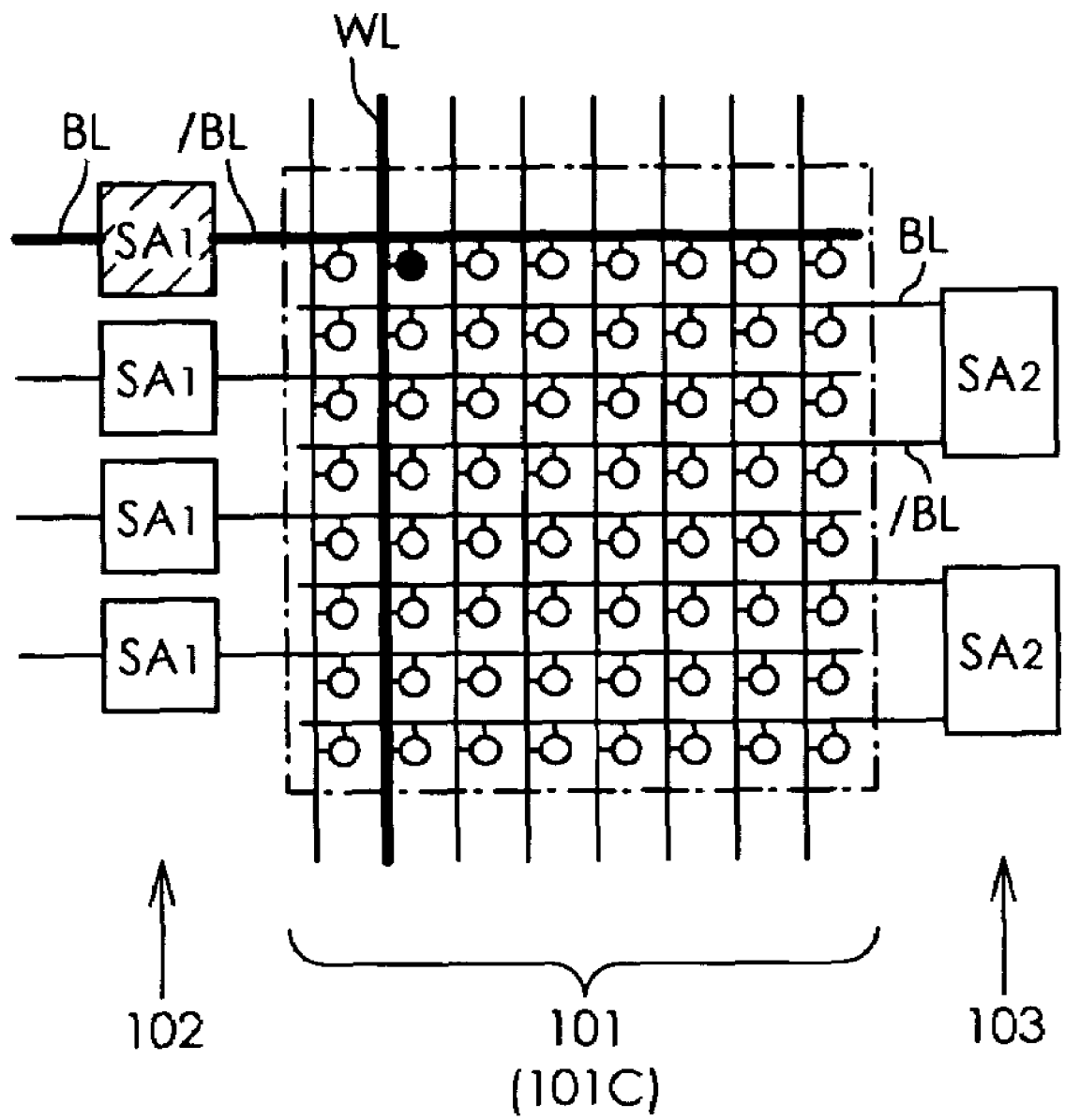
FIG. 2 is a circuit diagram showing the selection operation of a memory cell.
Figure 3:
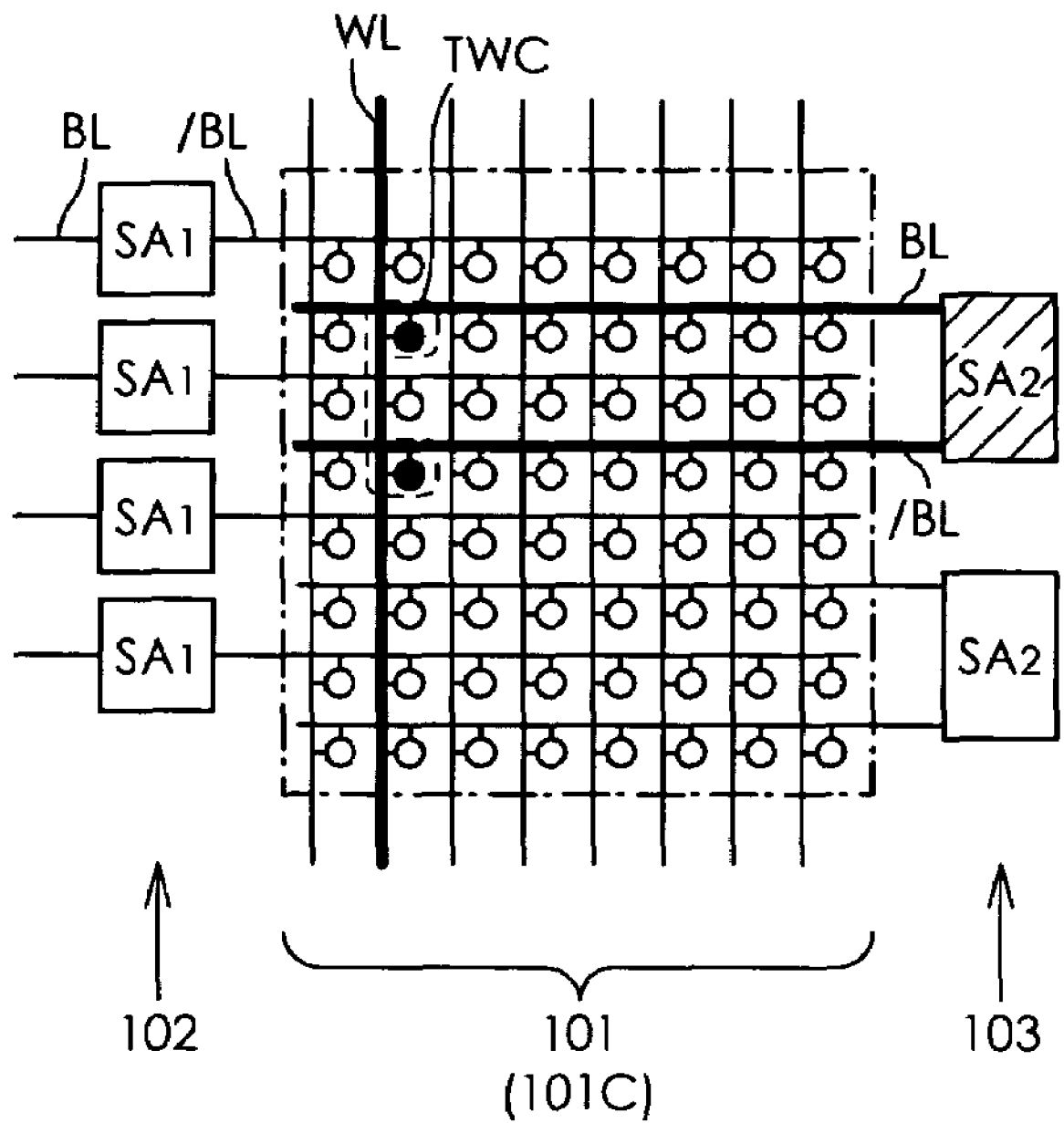
FIG. 3 is a circuit diagram showing the selection operation of a memory cell.

FIGS. 2 and 3 are circuit diagrams showing the selection operation of a memory cell.

As shown in FIG. 2, when the word line WL indicated by a bold line in the memory mat 101C is selected, all of the memory cells MC that are connected to that word line WL are selected. The selected word line WL herein intersects with only one bit line /BL in the pair of bit lines BL, /BL connected to the first sense amplifier SA1, and the other bit line BL in this pair of bit lines does not intersect the selected word line WL. It is therefore possible to select a single memory cell at the intersection with the first bit line /BL. The single memory cell (indicated by a black dot in the drawing) thus selected can therefore be used to store a single bit of data. The first sense amplifier SA1 can also read the single bit of data from the selected memory cell MC (black dot in the drawing) using the potential of the other bit line BL as a reference.

As shown in FIG. 3, the pair of bit lines BL, /BL connected to the second sense amplifier SA2 both intersect with the selected word line WL, and the two memory cells located at the intersection points in both bit lines BL, /BL are simultaneously selected. In other words, the two memory cells are selected as a twin cell TWC, and the information of the memory cells is treated as a single bit of data. A single bit of data is stored in complementary fashion in the two memory cells (black dots in the drawing) that constitute the twin cell TWC. Since two memory cells that each hold complementary information are simultaneously selected when data are read, a single bit of data can be read as a result of the fact that the second sense amplifier SA2 detects a difference in the potentials stored by these memory cells.

Figure 4:
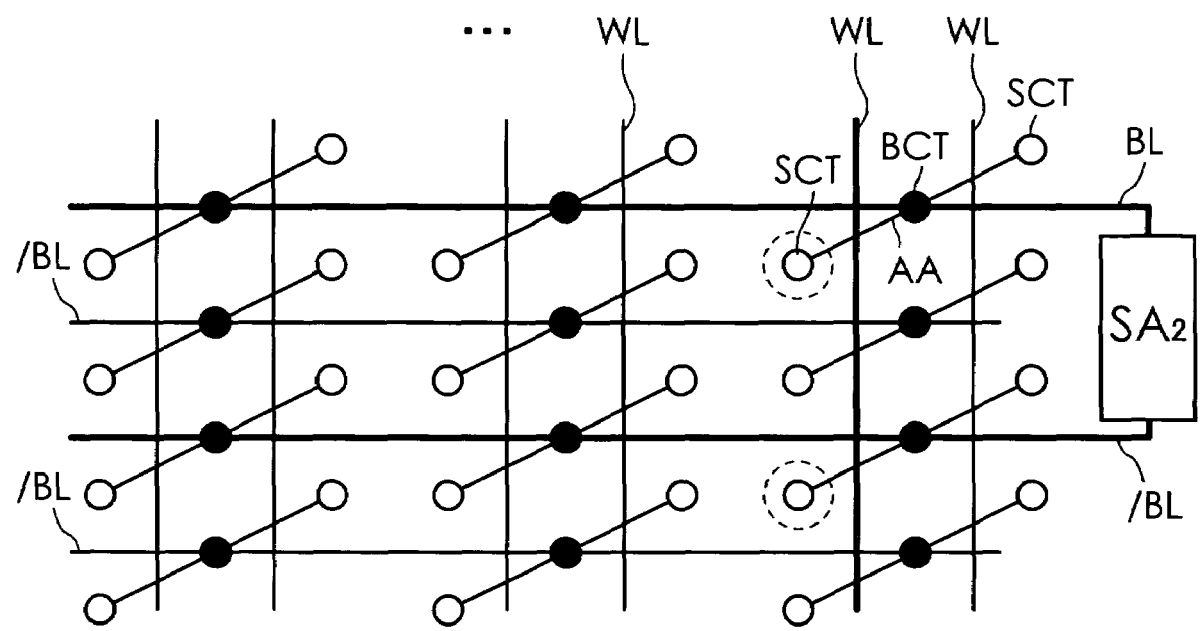
FIG. 4 is a schematic plan view showing the detailed structure of the memory cell layout in memory mat 101C.

FIG. 4 is a schematic plan view showing the detailed structure of the memory cell layout in memory mat 101C.

In memory mat 101C, word lines WL and bit lines BL, /BL are arranged in a lattice as described above, and an active region AA of a transistor is provided in a region where two adjacent word lines WL intersect with a single bit line BL or bit line /BL. Bit line contacts BCT (black dots in the drawing) are formed at the intersections of the active regions AA and the bit lines BL, /BL, and a storage node contact SCT (white circles in the drawing) is formed at both ends of each active region AA. A memory cell (MC) is formed at each intersection of a word line WL and a bit line BL, /BL by aligning these active regions AA in the row direction and column direction in this manner. The surface area of the memory cells thus formed is $6F^2$ ($2F \times 3F$). In this configuration, the two memory cells enclosed by a dashed line in the drawing are selected as a twin cell when the word line indicated by a bold line is selected. In other words, the information of the two memory cells is treated as a single bit of data in this case.

According to the present embodiment as described above, second sense amplifiers are connected according to a folded bit line system to second bit lines, which conventionally were dummy bit lines, and a twin-cell unit is formed using two memory cells provided at the intersections of second bit lines and a word line. It is therefore possible to utilize dummy cells that in the past were not connected to sense amplifiers and served no purpose. The cell density can thereby be enhanced, and the chip surface area can be reduced. Since twin cells and normal memory cells can both be disposed on a single chip, reduced power consumption and enhanced refresh characteristics can be anticipated. Furthermore, since the second sense amplifiers are configured according to a folded bit line system using two dummy bit lines that are arranged in every second row, it is possible to maintain a relatively wide spacing in the layout of the second sense amplifiers, and to arrange the second sense amplifiers so as to be concentrated on the outside of the terminal memory mats.

Furthermore, when twin cells are formed as redundant cells in the present embodiment, the number of redundant cells within the chip can be increased. In the past, the memory cells constituting a twin cell were not utilized, and it is therefore possible to increase only the number of redundant cells without reducing the capacity of a normal memory cell even when a twin cell is used as a redundant cell. Since a twin cell also has tREF characteristics that are superior to those of a single memory cell, even further enhancement of the tREF characteristics over those of a conventional redundant cell can be anticipated.

The tREF cycle is also long for bits composed of twin cells. Therefore, when twin cells are treated as being distinct from normal memory cells, the result is the same as if a memory device having two characteristics were formed on a single chip. Accordingly, a memory cell array composed of twin cells can be used as low-power memory, and both normal memory and small-scale memory with low power consumption can be present on a single chip.

The present invention has thus been shown and described with reference to specific embodiments. However, it should be noted that the present invention is in no way limited to the details of the described arrangements but changes and modifications may be made without departing from the scope of the appended claims.

Figure 5:
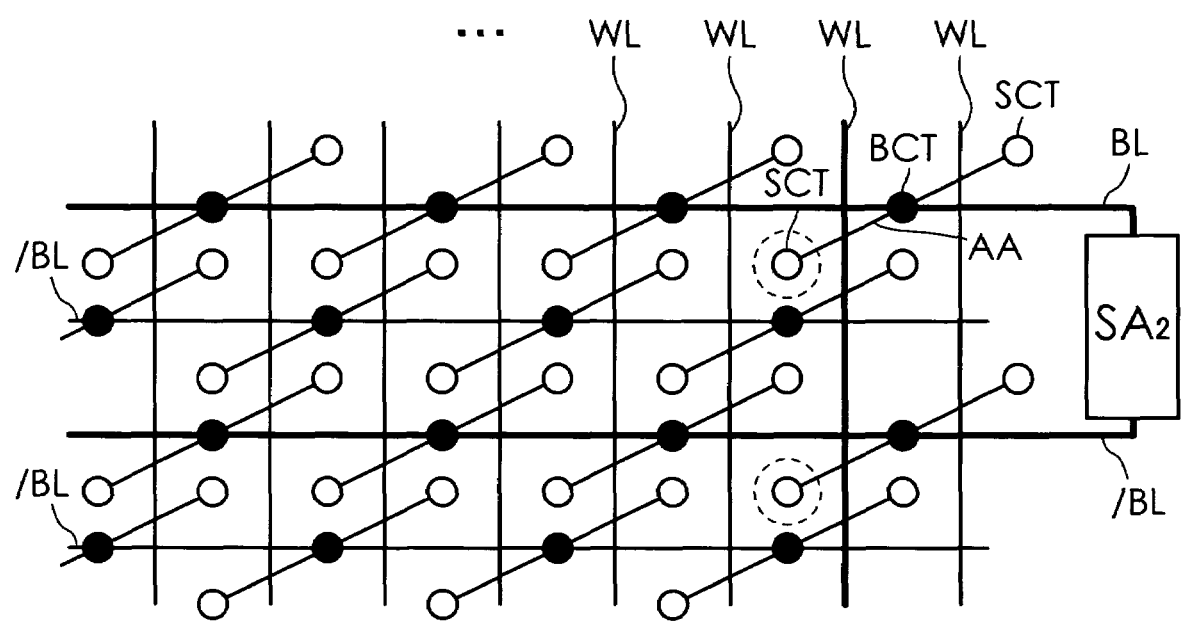
FIG. 5 is a schematic plan view showing another detailed structure of the memory cell layout in memory mat 101C.
Figure 6:
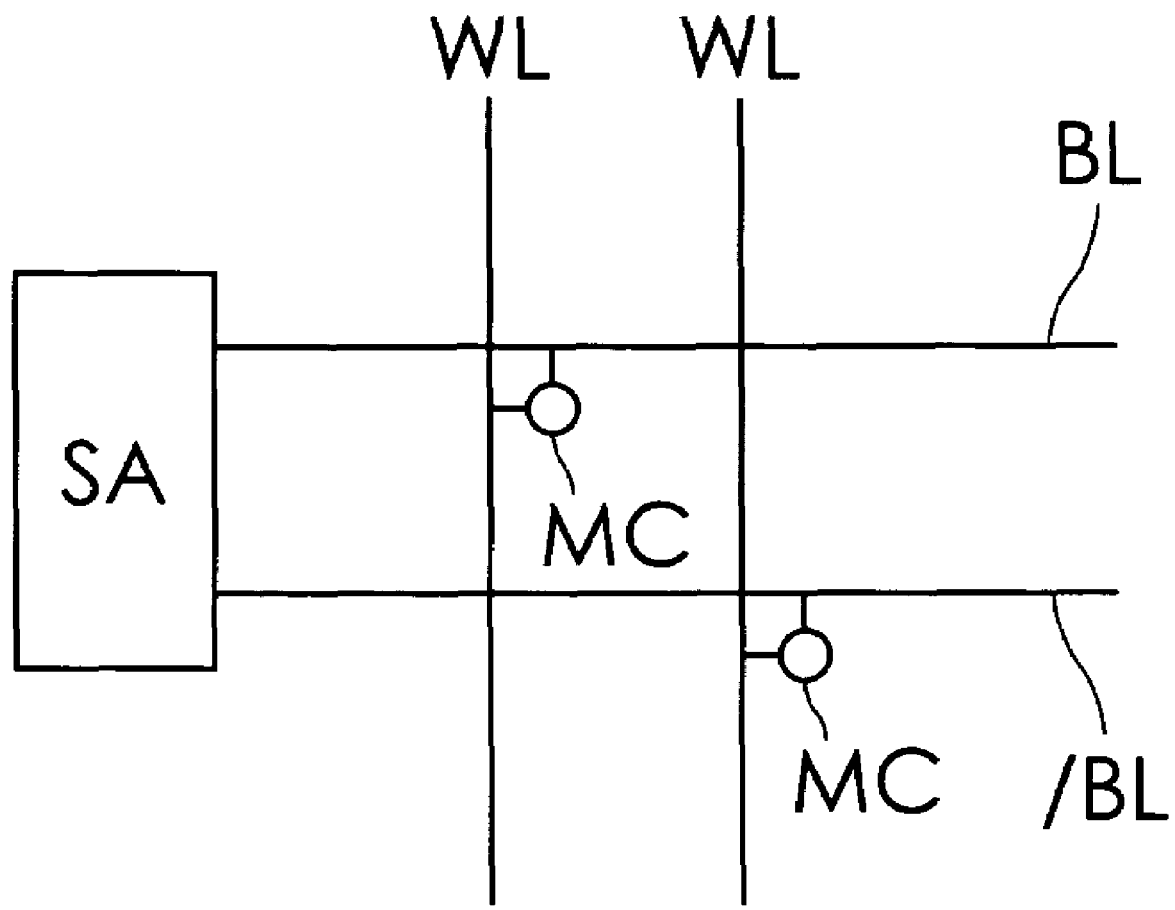
FIG. 6 is a circuit diagram showing the basic structure of a folded bit line system.
Figure 7:
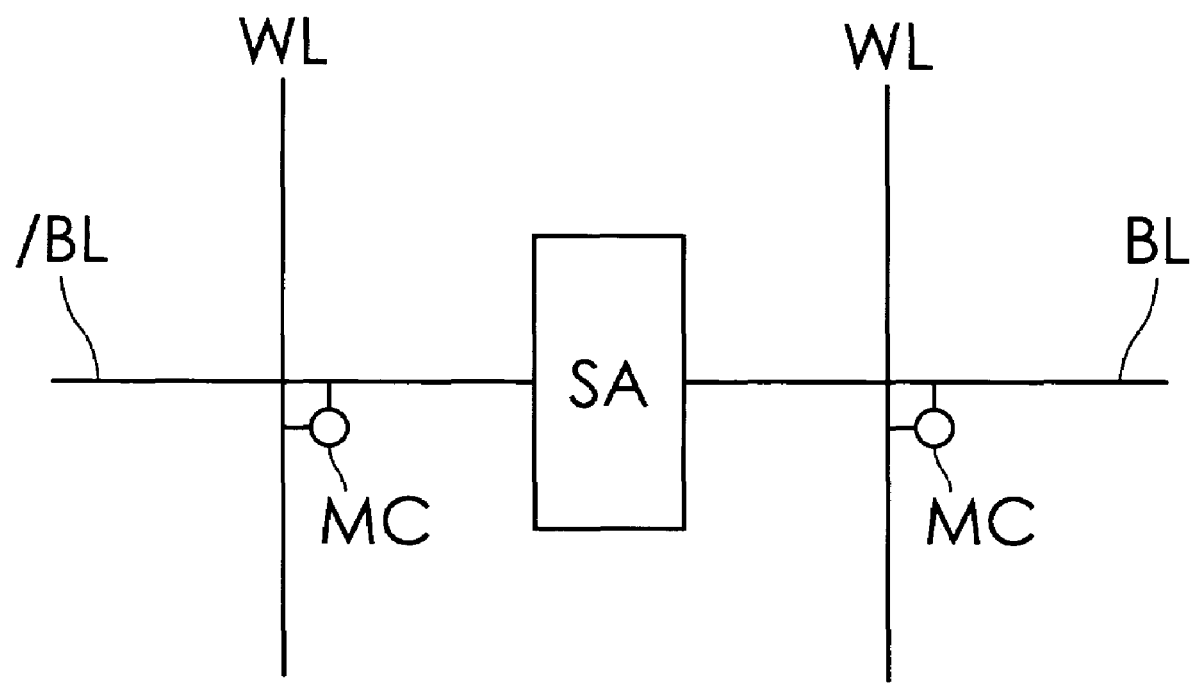
FIG. 7 is a circuit diagram showing the basic structure of the open bit line system.
Figure 8:
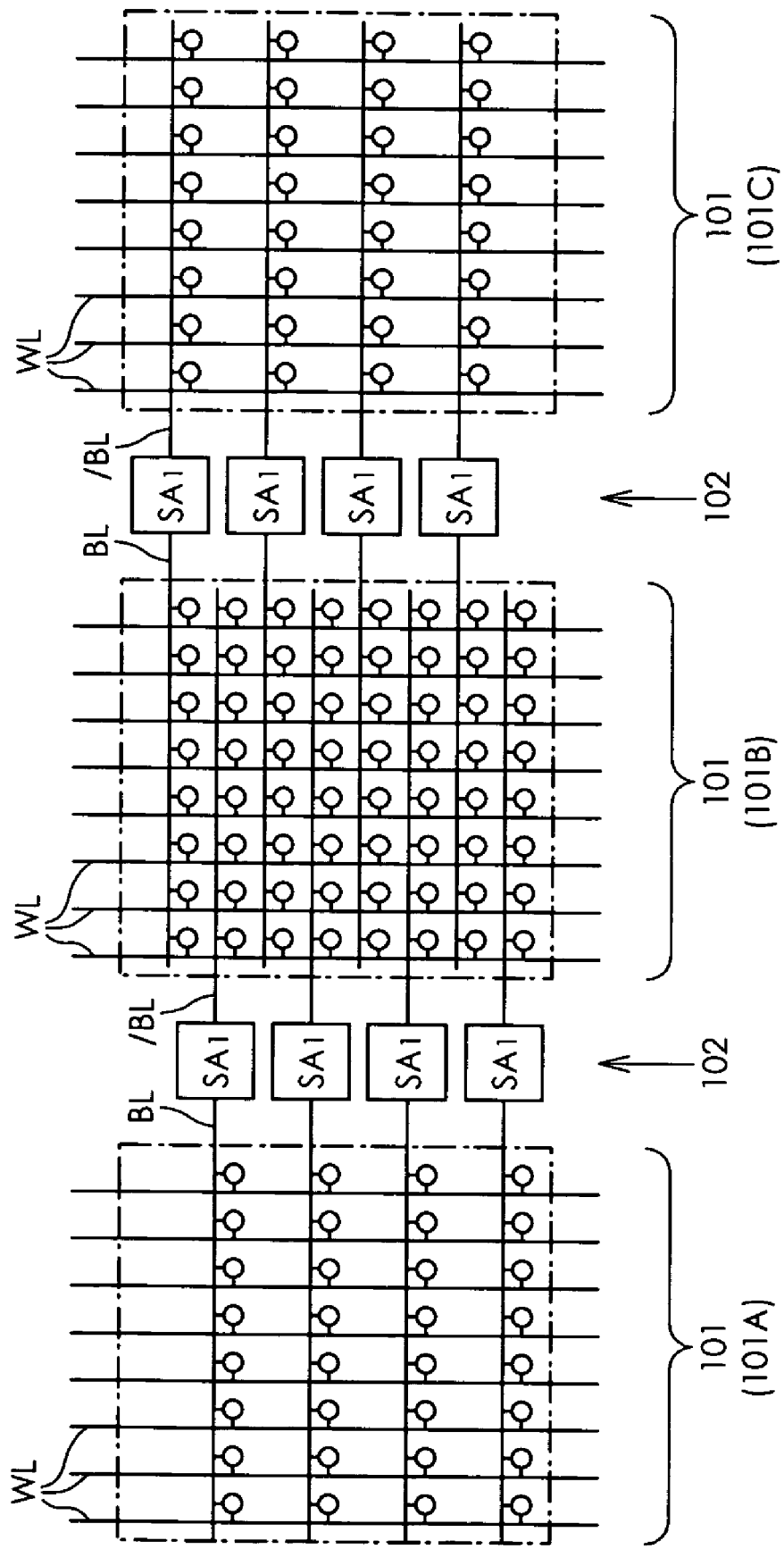
FIG. 8 is a schematic circuit diagram showing one structure of conventional DRAM.
Figure 9:
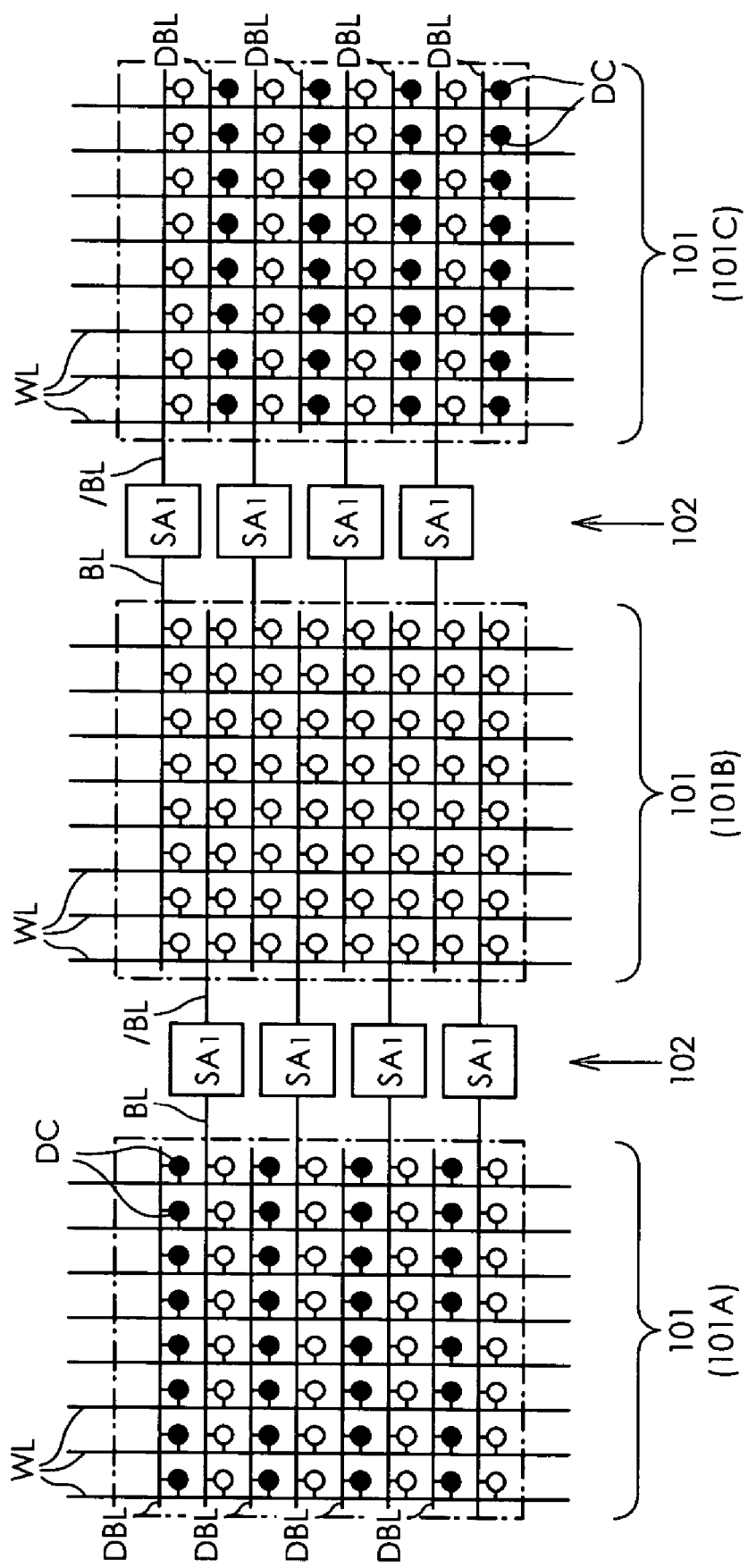
FIG. 9 is a schematic circuit diagram showing another structure of conventional DRAM.

For example, a case was described in the abovementioned embodiment in which active regions AA were arranged so as to be aligned in the row direction and the column direction as shown in FIG. 4. However, the rows of active regions AA may be arranged so that every second row is offset by 1F, for example, as shown in FIG. 5. In this structure, the memory cells enclosed by a dashed line in the drawing are selected as a twin cell when the word line indicated by the bold line is selected. In other words, the information of two memory cells is also treated as a single bit of data in this case.

It is apparent that insofar as the bit lines BL and /BL in the pairs of bit lines connected to the first and second sense amplifiers are in a complementary relationship, it does not matter which bit line is designated as BL or /BL.

A case was described in the abovementioned embodiment in which there was a single intermediate memory mat 101B, but it is apparent that a plurality of intermediate memory mats may also be used. Furthermore, the memory mats 101 may be arranged in a matrix instead of in a single row.

The example of a DRAM memory cell array was used in the abovementioned embodiment, but the present invention is not limited by this example, and can be applied in various types of semiconductor storage devices that use a folded bit line system and an open bit line system as methods of connecting bit lines and sense amplifiers.

What is claimed is:

1. A semiconductor storage device comprising:
   a plurality of memory mats and a plurality of sense amplifier array regions arranged in alternate fashion,
   wherein the plurality of sense amplifier array regions includes first sense amplifier array regions that are connected according to an open bit line system to bit lines included in memory mats that are adjacent on both sides, and second sense amplifier array regions that are connected according to a folded bit line system to bit lines included in a memory mat that is adjacent on one side.

2. The semiconductor storage device as claimed in claim 1, wherein the plurality of memory mats comprise intermediate memory mats between the first sense amplifier array regions, and terminal memory mats that are between the first sense amplifier array regions and the second sense amplifier array regions; that the terminal memory mats include first bit lines that are connected to corresponding memory cells in response to the activation of prescribed word lines, and second bit lines that are connected to corresponding memory cells in response to the activation of the prescribed word lines; and that the first and second bit lines both be connected to the same sense amplifiers provided to the second sense amplifier array region.

3. The semiconductor storage device as claimed in claim 1, wherein complementary data be stored by the memory cells disposed at the intersection points of the prescribed word lines and the first bit lines, and the memory cells disposed at the intersection points of the prescribed word lines and the second bit lines.

4. The semiconductor storage device as claimed in claim 2, wherein the terminal memory mats further comprise third bit lines that are connected to corresponding memory cells in response to activation of the prescribed word lines, wherein one end of the third bit lines are connected to, the sense amplifiers provided to the first sense amplifier array region.

5. The semiconductor storage device as claimed in claim 4, wherein the third bit lines are interposed between the first and second bit lines.

6. The semiconductor storage device as claimed in claim 3, wherein the terminal memory mats further comprise third bit lines that are connected to corresponding memory cells in response to activation of the prescribed word lines, wherein one end of the third bit lines are connected to the sense amplifiers provided to the first sense amplifier array region.

7. The semiconductor storage device as claimed in claim 6, wherein the third bit lines are interposed between the first and second bit lines.

8. A semiconductor storage device comprising:
   a plurality of word lines;
   a plurality of bit lines;
   a plurality of memory cells disposed at intersection points of the word lines and the bit lines; and
   a plurality of sense amplifiers that are connected to the bit lines, wherein
   the plurality of word lines includes first and second word lines that are activated exclusively;
   the plurality of bit lines includes first through third bit lines that are each connected to corresponding memory cells in response to activation of the first word lines, and fourth bit lines that are connected to corresponding memory cells in response to activation of the second word lines; and
   the plurality of sense amplifiers includes first sense amplifiers for amplifying potentials between the third and fourth bit lines, and second sense amplifiers for amplifying potentials between the first and second bit lines.

9. The semiconductor storage device as claimed in claim 8, wherein the first sense amplifiers be disposed at one end of the first through third bit lines, and that the second sense amplifiers be disposed at the other end of the first through third bit lines.

10. The semiconductor storage device as claimed in claim 8, wherein the first sense amplifiers be disposed between the third bit lines and the fourth bit lines.

11. The semiconductor storage device as claimed in claim 9, wherein the first sense amplifiers be disposed between the third bit lines and the fourth bit lines.

12. The semiconductor storage device as claimed in claim 8, wherein complementary data be stored by the memory cells disposed at the intersection points of the first word lines and the first bit lines, and the memory cells disposed at the intersection points of the first word lines and the second bit lines.

13. A semiconductor storage device comprising:
   a plurality of memory mats;
   first sense amplifier array regions provided between adjacent memory mats; and
   second sense amplifier array regions provided on the outside of terminal memory mats; wherein
   the plurality of memory mats includes a plurality of word lines, a plurality of bit lines, and a plurality of memory cells disposed at the intersection points of the word lines and the bit lines;
   the plurality of bit lines includes first bit line pairs that are connected according to an open bit line system to sense amplifiers provided to the first sense amplifier array regions, and second bit line pairs that are connected according to a folded bit line system to sense amplifiers provided to the second sense amplifier array regions; and
   two memory cells provided at the intersection points of the word lines and the second bit line pairs constitute a twin-cell unit for storing complementary data.

14. The semiconductor storage device as claimed in claim 13, wherein bit lines extending from the first sense amplifier array regions, and bit lines extending from the second sense amplifier array regions be wired in alternating fashion.

15. The semiconductor storage device as claimed in claim 14, wherein bit lines extending from the first sense amplifier array region on one side, and bit lines extending from the first sense amplifier array region on the opposite side be wired in alternating fashion to the intermediate memory mat that is interposed between the first sense amplifier array regions.

16. The semiconductor storage device as claimed in claim 13, wherein the twin cell unit comprises a redundant cell.

* * * * *